US007791888B2

(12) United States Patent
Tominaga et al.

(10) Patent No.: US 7,791,888 B2
(45) Date of Patent: Sep. 7, 2010

(54) ELECTRONIC CONTROL APPARATUS

(75) Inventors: Tsutomu Tominaga, Tokyo (JP); Masahiro Kimata, Tokyo (JP); Takayuki Kifuku, Tokyo (JP); Shuzo Akiyama, Tokyo (JP); Tadayuki Fujimoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 233 days.

(21) Appl. No.: 11/812,433

(22) Filed: Jun. 19, 2007

(65) Prior Publication Data
US 2008/0158823 A1 Jul. 3, 2008

(30) Foreign Application Priority Data
Dec. 27, 2006 (JP) .............................. 2006-352271

(51) Int. Cl.
H05K 7/20 (2006.01)
F28F 7/00 (2006.01)
H01L 23/34 (2006.01)
H01B 9/06 (2006.01)

(52) U.S. Cl. .................. 361/708; 361/709; 361/715; 361/713; 165/80.2; 165/80.3; 165/185; 257/712; 257/713; 257/721; 257/722; 174/15.1; 174/16.3; 174/17 R; 174/17.06; 174/17.08

(58) Field of Classification Search .................. 361/704, 361/708, 709, 710, 713, 715, 719; 165/80.2, 165/80.3, 185; 257/712, 713, 721, 722; 174/15.1, 16.3, 17 R, 17.06, 17.08
See application file for complete search history.

(56) References Cited
U.S. PATENT DOCUMENTS 5,657,203 A 8/1997 Hirao et al.

| 6,078,155 | A | 6/2000 | Tominaga et al. |
| 6,225,701 | B1 * | 5/2001 | Hori et al. .................... 257/783 |
| 6,282,095 | B1 * | 8/2001 | Houghton et al. ........... 361/704 |
| 6,315,598 | B1 | 11/2001 | Elliot et al. |
| 6,337,796 | B2 * | 1/2002 | Yamada et al. .............. 361/719 |
| 6,503,090 | B2 | 1/2003 | Onizuka |
| 6,724,627 | B2 * | 4/2004 | Onizuka et al. ............. 361/704 |

(Continued)

FOREIGN PATENT DOCUMENTS
DE   102005041051 A1   3/2006

(Continued)

OTHER PUBLICATIONS
German Office Action dated Jul. 25, 2008.

*Primary Examiner*—Zachary M Pape
(74) *Attorney, Agent, or Firm*—Sughrue Mion, PLLC

(57) ABSTRACT

An electronic control apparatus can be reduced in size and cost by eliminating certain parts such as a power board, etc. The apparatus includes a housing, a heat sink attached to one end of the housing, semiconductor switching elements mounted on the heat sink, a circuit board arranged in opposition to the heat sink, and a plurality of conductive plates electrically connecting the circuit board and the semiconductor switching elements. The heat sink is composed of a heat sink main body, and an anodized aluminum film formed at least on a surface of the heat sink main body at a side at which the power device is mounted thereon, and the heat sink main body has outer peripheral end faces arranged in opposition to inner wall surfaces of an opening portion of the housing.

14 Claims, 8 Drawing Sheets

U.S. PATENT DOCUMENTS 7,081,691 B2    7/2006    Kawata

FOREIGN PATENT DOCUMENTS

| JP | 9-134985 A | 5/1997 |
| --- | --- | --- |
| JP | 11-12797 A | 1/1999 |
| JP | 2002-293202 A | 10/2002 |
| JP | 2003-124662 A | 4/2003 |
| JP | 2003-309384 A | 10/2003 |
| JP | 3508679 B2 | 1/2004 |
| JP | 2004-247561 A | 9/2004 |
| JP | 3644835 B2 | 2/2005 |
| JP | 2005-143264 A | 6/2005 |
| JP | 2005-327791 A | 11/2005 |
| JP | 2006-100750 A | 4/2006 |

* cited by examiner

ELECTRONIC CONTROL APPARATUS

BACKGROUND OF THE INVENTION

1. Field of the Invention

The present invention relates to an electronic control apparatus used in an electric power steering system for providing an assist force to a steering system of a vehicle by means of the rotational force of an electric motor.

2. Description of the Related Art

In the past, there has been known an electronic control apparatus in which a semiconductor switching element (FET), being a power device, is mounted on a metal substrate, and at the same time, a connecting member for electrically connecting between the metal substrate and parts outside the metal substrate is mounted on the metal substrate.

For example, an electronic control apparatus described in a patent document (Japanese patent No. 3644835) includes a power board on which a bridge circuit comprising semiconductor switching elements are mounted for switching a current supplied to an electric motor, a housing with conductive plates, etc., insert molded into an insulating resin and having high current parts mounted thereon, a control board having low current parts such as a microcomputer, etc., mounted thereon, a connecting member for electrically connecting the power board, the housing and the control board to one another, a heat sink being in intimate contact with the power board, and a casing press mounted on the heat sink and molded from a metal plate so as to cover the power board, the housing and the control board.

In the electronic control apparatus described in the above-mentioned first patent document, the power board on which the semiconductor switching elements are mounted is required.

Although the connecting member is fixedly secured to the power board so as not to float at the time of soldering, an impact force generated when the connecting member is fixed onto the power board is transmitted to component parts such as the semiconductor elements on the power board before soldering thereof, so there occur positional shifts of such component parts.

As a result, there is the following problem. That is, the number of parts required increases, thus making the size of the electronic control apparatus larger and the production cost thereof higher, and the reliability of soldered joints of the parts mounted on the power board is reduced.

SUMMARY OF THE INVENTION

Accordingly, the present invention is intended to obviate the problems as referred to above, and has for its object to provide an electronic control apparatus in which certain parts are eliminated so as to reduce the size and the cost of production thereof, while improving the reliability of electrical connection.

Bearing the above objects in mind, according to the present invention, there is provided an electronic control apparatus which includes: a housing that is made of an insulating resin and has a pair of opening portions at opposite ends thereof, respectively; a heat sink that is attached to one end of the housing; a power device that is mounted on the heat sink; a circuit board that is arranged in opposition to the heat sink, and has an electronic circuit including a control circuit for controlling the power device; and a plurality of conductive plates that have their basal portions held by the housing and electrically connect the circuit board and the power device to each other. The heat sink is composed of a heat sink main body, and an insulating film that is formed at least on a surface of the heat sink main body at a side at which the power device is mounted thereon; and the heat sink main body has outer peripheral end faces arranged in opposition to inner wall surfaces of one of the opening portions of the housing.

With the electronic control apparatus defined above according to the present invention, it is possible to reduce the size and the production cost of the electronic control apparatus, as well as to improve the reliability of electrical connection, etc.

The above and other objects, features and advantages of the present invention will become more readily apparent to those skilled in the art from the following detailed description of preferred embodiments of the present invention taken in conjunction with the accompanying drawings.

BRIEF DESCRIPTION OF THE DRAWINGS

Now, preferred embodiments of the present invention will be described in detail while referring to the accompanying drawings. Throughout respective figures, the same or corresponding members or parts are identified by the same reference numerals and characters.

EMBODIMENT 1

In this embodiment, description will be made by taking, as an example, an electronic control apparatus 1 used in an electric power steering system that serves to assist a steering system of a vehicle by means of the rotational force of an electric motor.

Figure 1:
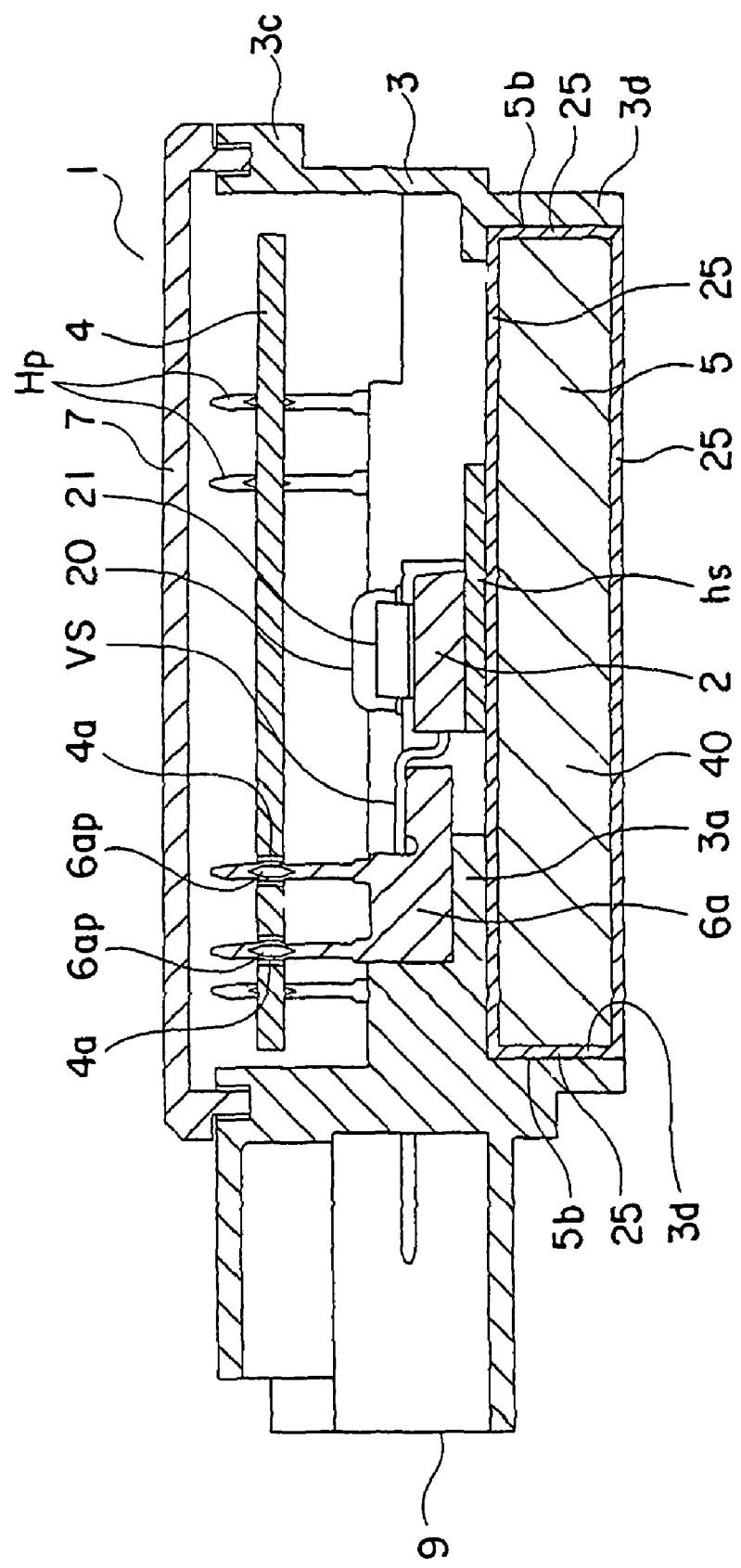
FIG. 1 is a cross sectional view showing an electronic control apparatus in an electric power steering system according to a first embodiment of the present invention.
Figure 2:
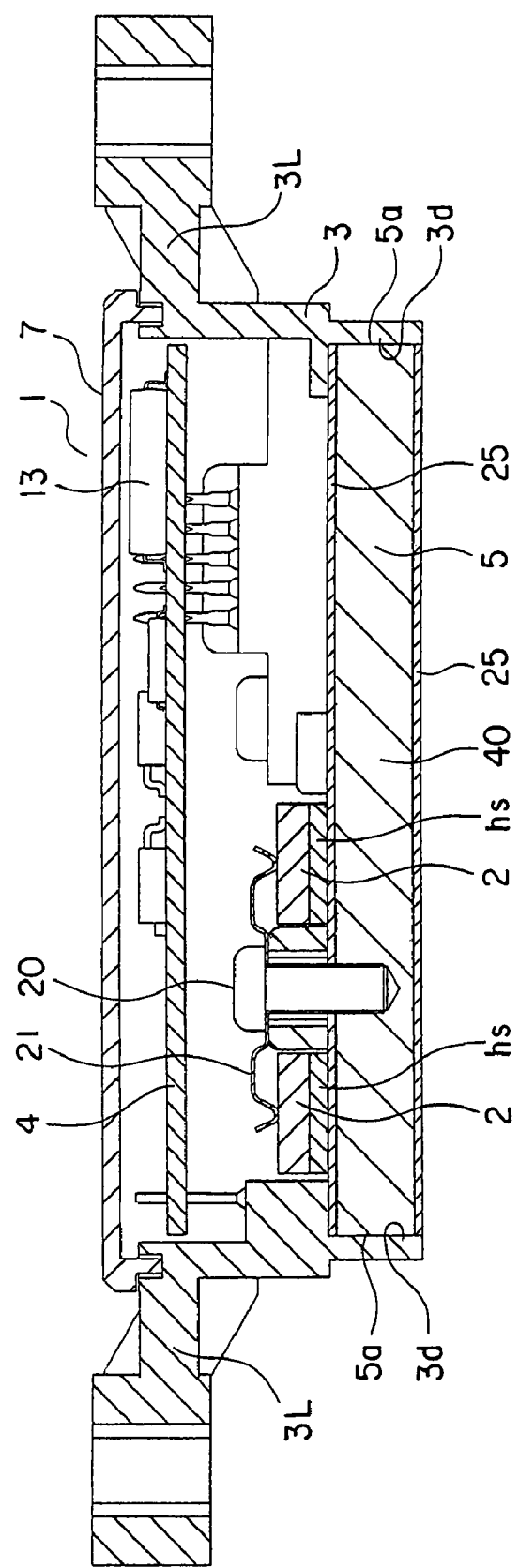
FIG. 2 is a cross sectional view cut off at right angles to the cross-section of the electronic control apparatus shown in FIG. 1.
Figure 3:
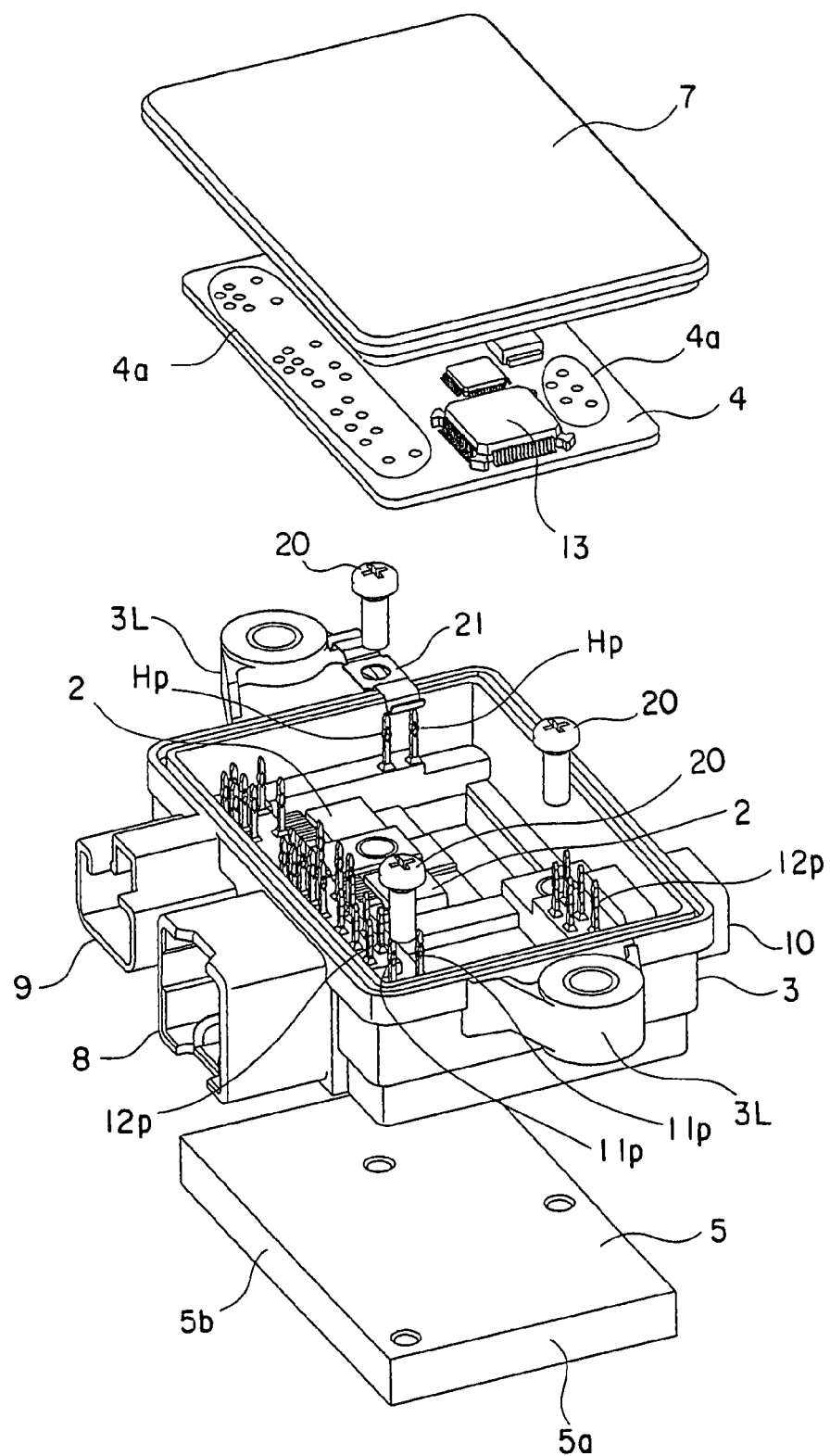
FIG. 3 is an exploded perspective view showing the electronic control apparatus in FIG. 1.
Figure 4:
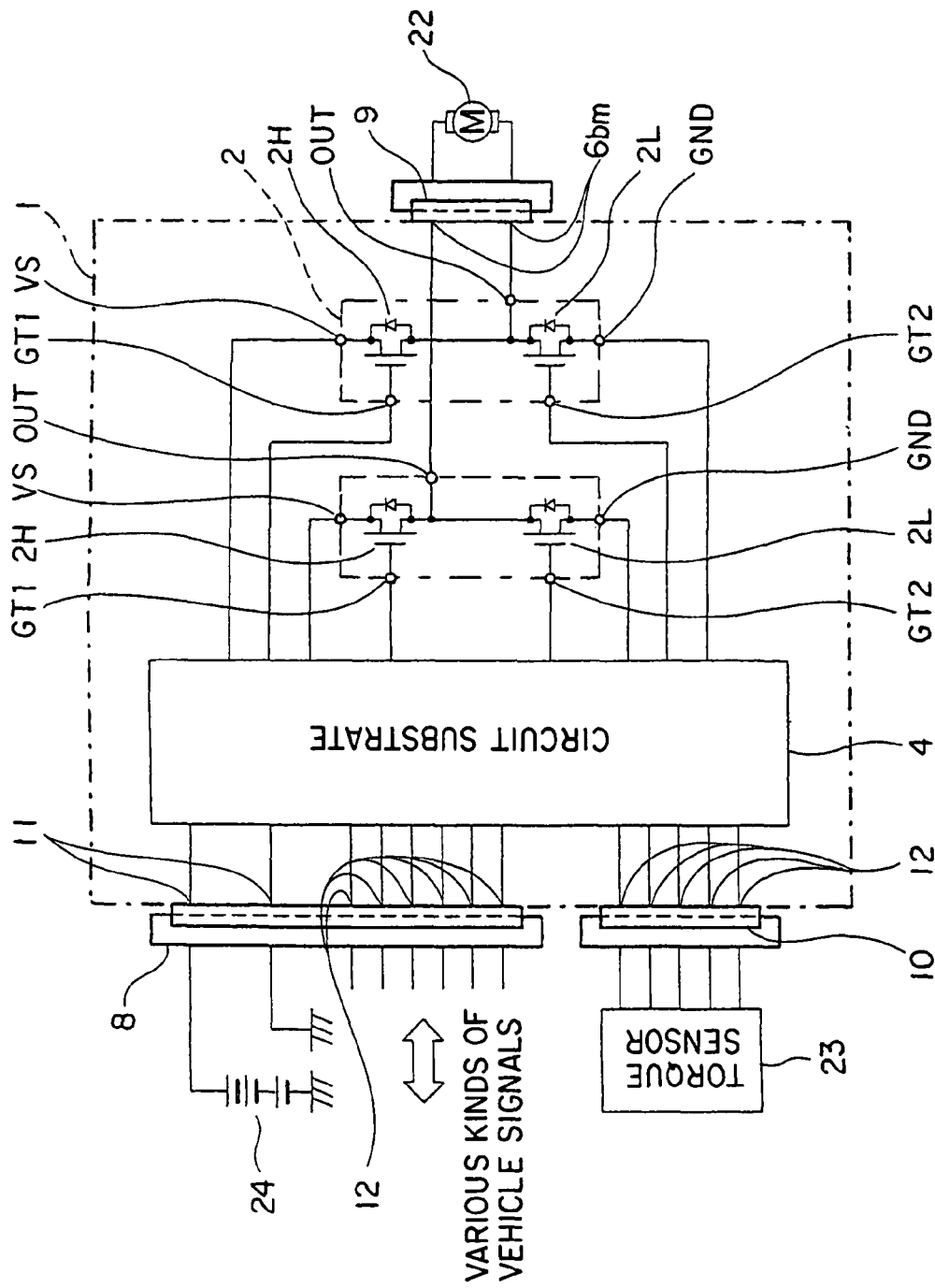
FIG. 4 is a block diagram showing the electric power steering system in FIG. 1.
Figure 5:
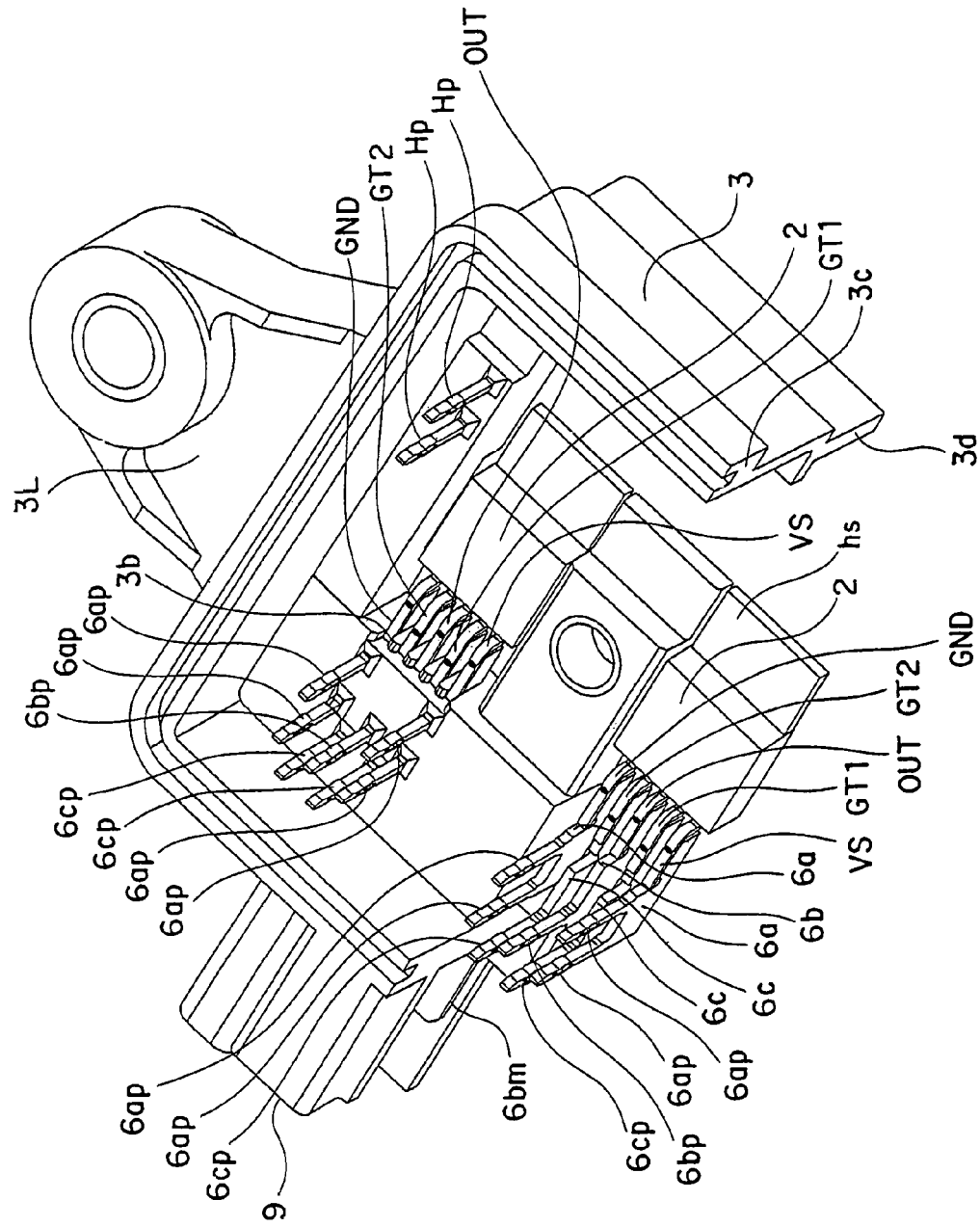
FIG. 5 is a perspective view showing the essential portions of the electronic control apparatus of FIG. 1.

Referring to the drawings and first to FIG. 1, there is shown, in cross section, an electronic control apparatus according to a first embodiment of the present invention. FIG. 2 is a cross sectional view cut off at right angles to the cross-section of the electronic control apparatus shown in FIG. 1. FIG. 3 is an exploded perspective view showing the electronic control apparatus in FIG. 1. FIG. 4 is a block diagram showing the electric power steering system in FIG. 1. FIG. 5 is a perspective view showing the essential portions of the electronic control apparatus of FIG. 1.

The electronic control apparatus 1 includes: a housing 3 made of an insulating resin and having a pair of opening portions at opposite ends thereof; a heat sink 5 made of aluminum and attached to one end of the housing 3; semiconductor switching elements 2 that are mounted on the heat sink 5 and constitute a power device; a circuit board 4 that is arranged in opposition to the heat sink 5, and has an electronic circuit formed thereon including a control circuit for controlling the semiconductor switching elements 2; power conductive plates 6a, output conductive plates 6b and signal conductive plates 6c that are integrally formed with the housing 3 by means of insert molding of an insulating resin 3a so as to electrically connect the circuit board 4 and the semiconductor switching elements 2 to each other; and a cover 7 that is attached to the other end of the housing 3 for receiving the semiconductor switching elements 2 and the circuit board 4 in cooperation with the heat sink 5.

In addition, the electronic control apparatus 1 is further provided with a vehicle connector 8 that is arranged at one side of the housing 3 and is electrically connected to wiring of the vehicle, a motor connector 9 that is arranged at the one side of the housing 3 and is electrically connected to an electric motor 22, and a sensor connector 10 that is arranged at the other side surface of the housing 3 and is electrically connected to a torque sensor 23.

Upon formation of the housing 3 by insert molding, the vehicle connector 8, the motor connector 9 and the sensor connector 10 are simultaneously integrated with the power supply connector terminals 11, the motor connector terminal portion 6bm and the sensor connector terminals 12 of the output conductive plate 6b, respectively.

In addition, in the vicinity of the other end of the housing 3, i.e., an opening portion thereof at a side opposite to the opening portion thereof in which the heat sink 5 is arranged, the housing 3 is formed with a pair of mounting leg portions 3L by which the electronic control apparatus 1 is mounted onto a vehicle that is an installation or mounting object.

The heat sink 5 is composed of a heat sink main body 40, and an alumite or anodized aluminum film 25 that is an insulating film formed on a surface of the heat sink main body 40. The heat sink 5 is formed as follows. That is, a heat sink material is first produced which is composed of an elongated, extruded shaped material that is made by extruding aluminum or aluminum alloy from a die and has an anodized aluminum film 25 formed on the entire surfaces thereof beforehand, and then the heat sink material thus produced is cut to a desired length by a cutting machine to form the heat sink 5. The heat sink 5, having been thus formed by cutting the heat sink material by means of the cutting machine, has one pair of opposite outer peripheral end faces, which are cut surfaces 5a exposed to the outside, and another pair of opposite outer peripheral end faces 5b, which are arranged orthogonal to the above-mentioned ones 5a and have the anodized aluminum film 25 formed thereon. Also, the heat sink 5 has a front surface, on which the semiconductor switching elements 2 are mounted, and a rear surface, with the anodized aluminum film 25 being formed on these front and rear surfaces.

The cut surfaces 5a are arranged in opposition to inner wall surfaces 3d of the housing 3, as shown in FIG. 2.

Here, the heat sink 5 is produced by using the extruded shaped material, but may instead be produced by using a hot or cold rolled plate material. Also, an insulative precoated aluminum material in which an insulating resin is precoated on a surface(s) of aluminum or aluminum alloy may be used as the heat sink material. In this case, surfaces on which the insulating resin is not precoated, e.g., four side end surfaces thereof, are arranged in opposition to the inner wall surfaces 3d of the housing 3.

In addition, even if the insulating film is the anodized aluminum film 25, the four faces of the outer peripheral end faces of the heat sink main body 40 may be exposed to the outside and arranged in opposition to the inner wall surfaces 3d of the housing 3.

A heat spreader hs, which serves as a heat dissipation portion of the semiconductor switching elements 2, is fixedly attached to a surface of the heat sink 5 on which the anodized aluminum film 25 is formed, by a fastening element in the form of a screw 20 through an resilient member in the form of a plate spring 21 while being placed in intimate contact with the heat sink 5. At this time, the plate spring 21 presses the resin package surfaces of the semiconductor switching elements 2.

The heat spreader hs of the semiconductor switching elements 2, being electrically connected to the bridge output terminals OUT, is electrically insulated from the heat sink 5 by means of the anodized aluminum film 25.

The surface of the heat spreader hs has small irregularities, so even if the heat spreader hs of the semiconductor switching elements 2 is placed in intimate contact with the heat sink 5 under the action of the plate spring 21, there will occur a slight gap therebetween, in which, however, a grease of high thermal conductivity (not shown) is interposed.

Here, note that a first adhesive resin of high thermal conductivity may be used as a means for making the heat spreader hs of the semiconductor switching elements 2 into intimate contact with the heat sink 5 thereby to fixedly attach the heat spreader hs to the heat sink 5. In this case, it becomes unnecessary to use the above-mentioned grease which would otherwise be interposed in the gap between the heat spreader hs and the heat sink 5.

Each of the semiconductor switching elements 2 has a high side MOSFET 2H and a low side MOSFET 2L integrated with each other to form a half bridge, as shown in FIG. 4. In each of the semiconductor switching elements 2, the half bridge thus formed is received in one package, and a pair of half bridges form a bridge circuit for switching a current supplied to the electric motor 22.

The individual terminals of the semiconductor switching element 2 are arranged in a side by side relation from the left side to the right side in the order of a power supply terminal VS, a gate terminal GT1 and a bridge output terminal OUT of the high side MOSFET 2H, and a gate terminal GT2 and a ground terminal GND of the low side MOSFET 2L in FIG. 4.

Here, note that the power supply terminal VS, the bridge output terminal OUT and the ground terminal GND of each semiconductor switching element 2 are large current terminals through which a large current for the electric motor 22 flows, whereas the gate terminal GT1 and the gate terminal GT2 of each semiconductor switching element 2 are small current terminals through which a small current for a signal flows, and the large current terminals and the small current terminals are arranged in an alternate manner.

In addition, the individual terminals VS, GT1, OUT, GT2, GND of the semiconductor switching elements 2 respectively lead out or extend in the same direction with the same shape to upstand vertically and then bend perpendicularly at two locations of their intermediate portions.

A microcomputer 13 is mounted on a wiring pattern on the circuit board 4 by soldering. Though not illustrated in FIG. 2, mounted on the wiring pattern on the circuit board 4 by soldering are a coil for preventing electromagnetic noise generated upon switching operation of the semiconductor switching elements 2 from flowing out to the outside, capacitors for absorbing ripples of motor current, a motor current detection circuit including shunt resistors, peripheral circuit elements, and so on.

Also, in the circuit board 4, there are formed a plurality of through holes 4a which have copper plating applied to their inner surfaces and are electrically connected to the wiring pattern.

Each of the power conductive plates 6a has a basal end portion connected to a tip end of the power supply terminal VS and a tip end of the ground terminal GND of a corresponding semiconductor switching element 2, respectively. The output conductive plate 6b has a basal end portion connected to a tip end of the bridge output terminal OUT. The signal conductive plate 6c has a basal end portion connected to tip ends of the gate terminals GT1, GT2, respectively.

These conductive plates 6a, 6b, 6c extend in a lead-out direction in which the terminals VS, GT1, OUT, GT2, GND of the semiconductor switching elements 2 lead out, so as to be arranged in an overlapped manner, and are bonded thereto by laser welding.

These conductive plates 6a, 6b, 6c are formed with press-fit terminal portions 6ap, 6bp, 6cp, respectively, and the press-fit terminal portions 6ap, 6bp, 6cp are press-fitted into the individual through holes 4a, respectively, in the circuit board 4, so that the terminals VS, GT1, OUT, GT2, GND of the semiconductor switching elements 2 are electrically connected to the wiring pattern of the circuit board 4.

The conductive plates 6a, 6b, 6c are made of a material of good electrical conductivity such as high-strength, highly conductivity copper alloy or phosphor bronze in consideration of electrical conductivity for supplying a large current and the mechanical strength required to form the press-fit terminal portions 6ap, 6bp, 6cp. For example, the phosphor bronze is used on the condition under 30 A in motor current.

In addition, the output conductive plate 6b is formed at its tip end with the motor connector terminal portion 6bm, so that the motor current from the bridge output terminal OUT of the semiconductor switching elements 2 flows directly to the electric motor 22 via the motor connector terminal portion 6bm without passing through the circuit board 4. The output conductive plate 6b is formed at its intermediate portion with the press-fit terminal portion 6bp extending toward the circuit board 4, so that a signal to monitor the voltage of the motor connector terminal portion 6bm is output from the press-fit terminal portion 6bp to the circuit board 4.

The terminals VS, GT1, OUT, GT2, GND of the semiconductor switching elements 2 are formed in such a manner that they have a width of 0.8 mm, a thickness of 0.5 mm and an interval between adjacent terminals of 1.7 mm. In each of the terminals VS, OUT, GND where a large current flows, the electrical resistance thereof becomes larger in accordance with the increasing length thereof, so the generation of heat increases.

In this first embodiment of the present invention, to suppress the generation of heat, the welding between the power supply terminals VS and the power conductive plates 6a, the welding between the ground terminals GND and the power conductive plates 6a, and the welding between the bridge output terminals OUT and the output conductive plates 6b are respectively performed at locations close to the semiconductor switching elements 2, respectively.

In addition, the interval between the adjacent individual terminals VS, GT1, OUT, GT2, GND is narrow, so in order to prevent a short circuit between the terminals VS, GT1, OUT, GT2, GND, the welding positions of the gate terminals GT1 and the signal conductive plates 6c, and the welding positions of the gate terminals GT2 and the signal conductive plates 6c are not close to the individual welding positions where the welding of the power supply terminals VS and the power conductive plates 6a, the welding of the ground terminals GND and the power conductive plates 6a, and the welding of the bridge output terminals OUT and the output conductive plates 6b are respectively performed, and they are also away from the semiconductor switching elements 2 because of a small current flowing into the terminals GT1, GT2. These welding positions are indicated by filled circles in FIG. 5.

As shown in FIG. 5, wherein the housing 3 is formed with positioning portions 3b for performing the positioning of the individual terminals VS, GT1, OUT, GT2, GND of the semiconductor switching elements 2 with respect to the conductive plates 6a, 6b, 6c. The positioning portions 3b protrude between the individual adjacent terminals VS, GT1, OUT, GT2, GND of the semiconductor switching elements 2, and have tapered portions formed at their tip ends, respectively. The tip ends of the individual terminals VS, GT1, OUT, GT2, GND of the semiconductor switching elements 2 are respectively guided and positioned by their tapered portions, so that the individual terminals VS, GT1, OUT, GT2, GND are welded to the conductive plates 6a, 6b, 6c.

In addition, though the power conductive plates 6a and the output conductive plates 6b are made of rolled copper or copper alloy, a large current flows upon welding of the rolled surfaces (the front surfaces) of the conductive plates 6a, 6b and the terminals VS, OUT, GND of the semiconductor switching elements 2, so it is necessary to increase the thickness of the conductive plates 6a, 6b.

However, it is difficult to increase the thickness of the conductive plates 6a, 6b from the viewpoint of the formation of the press-fit terminal portions and the press working thereof.

In this first embodiment, the thickness of the conductive plates 6a, 6b, being power conductive plates, is set to 0.8 mm, which is the same as the width of the terminals VS, OUT, GND, so that the width of the conductive plates 6a, 6b is formed wider than the thickness thereof, and the terminals VS, OUT, GND of the semiconductor switching elements 2 are welded to the end faces of the conductive plates 6a, 6b orthogonal to the rolled surfaces thereof.

That is, the conductive plates 6a, 6b are formed in such a manner that they have a size or length in a direction of connection to the terminals VS, OUT, GND larger than that (widthwise direction) in a direction orthogonal to the direction of connection.

Here, note that a small current flows through the signal conductive plates 6c, so there is no need to consider the reduction in the electrical resistance of the signal conductive plates 6c, which are, however, formed of a plate material similar to that for the power conductive plates 6a and the output conductive plates 6b.

Also, laser welding is performed by irradiating a laser beam from a terminal (VS, GT1, OUT, GT2, GND) side of the semiconductor switching elements 2 having a thin thickness.

Each of the power conductive plates 6a is formed with two press-fit terminal portions 6ap; each of the output conductive plates 6b is formed with one press-fit terminal portion 6bp; and each of the signal conductive plates 6c is formed with one press-fit terminal portion 6cp. Thus, seven press-fit terminal portions 6ap, 6bp, 6cp are arranged for one semiconductor switching element 2.

The distance between the adjacent terminals VS, GT1, OUT, GT2, GND of the semiconductor switching elements 2 is 1.7 mm, as previously stated, and the hole-diameter of the through holes 4a in the circuit board 4 into which the press-fit terminal portions 6ap, 6bp, 6cp are press-fitted is formed to be 1.45 mm.

In this first embodiment, the press-fit terminal portions 6ap, 6bp, 6cp of the adjacent conductive plates 6a, 6b, 6c are arranged in a staggered manner, so that the distance between the adjacent press-fit terminal portions 6*ap*, 6*bp*, 6*cp* is set longer than the distance between the adjacent terminals VS, GT1, OUT, GT2, GND of the semiconductor switching elements 2.

Moreover, the insulating resin 3*a* of the housing 3 is interposed between the power conductive plate 6*a* and the heat sink 5, between the output conductive plates 6*b* and the heat sink 5, and between the signal conductive plates 6*c* and the heat sink 5, respectively.

Further, the power supply connector terminals 11 of the vehicle connector 8 are made of copper or copper alloy having a thickness of 0.8 mm, similar to the conductive plates 6*a*, 6*b*, 6*c*, and are each formed with two press-fit terminal portions 11*p*. In addition, the power supply connector terminals 11 are identical with the output conductive plates 6*b* except for the number of the press-fit terminal portions 11*p*.

Figure 6:
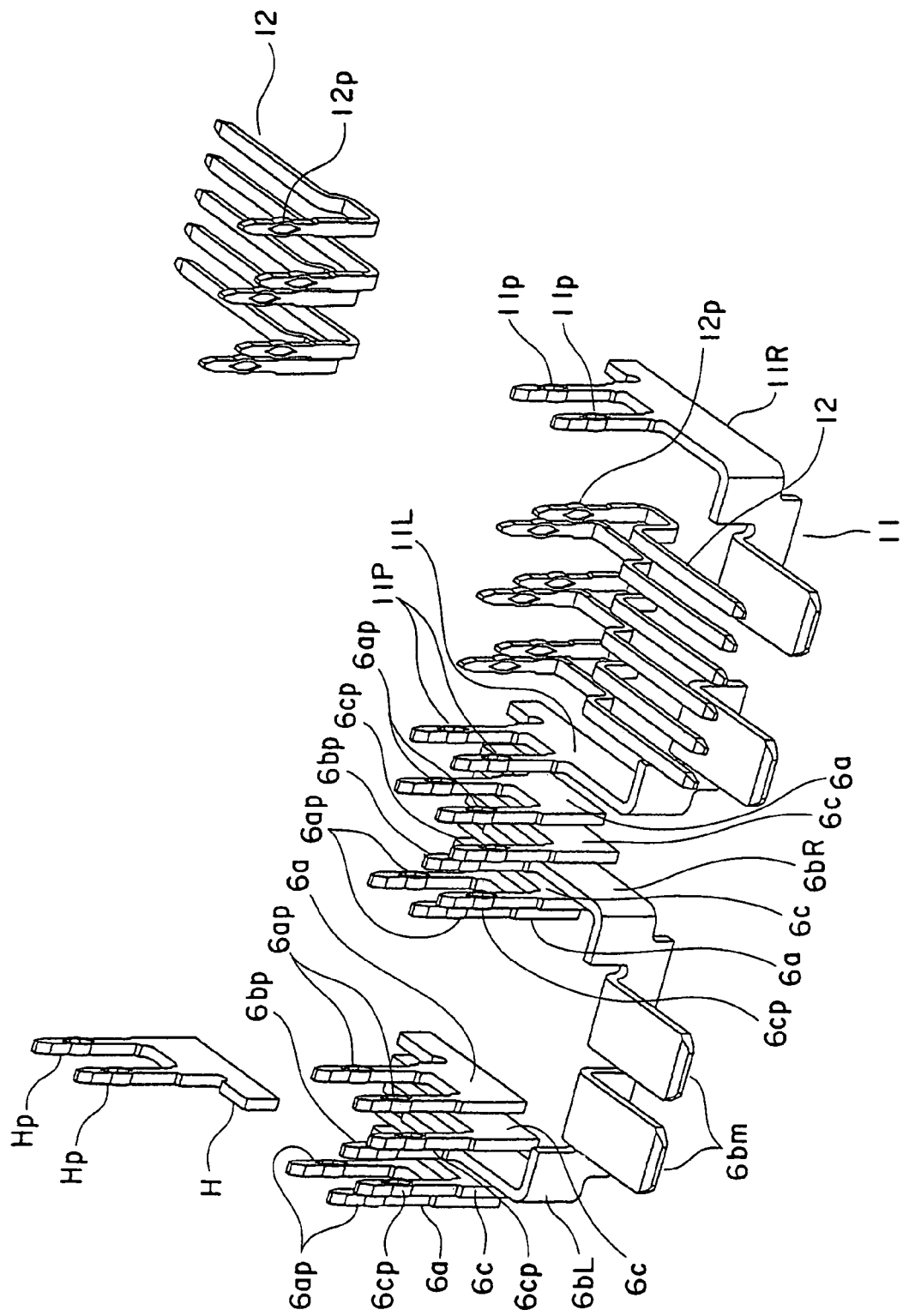
FIG. 6 is a perspective view showing the arrangement of individual conductive plates, individual connector terminals, and individual holding members in the electronic control apparatus of FIG. 1.

The motor connector 9 and the vehicle connector 8 are arranged in parallel to each other, as shown in FIG. 3, and the output conductive plates 6*b* and the power supply connector terminals 11 are respectively arranged in pair in bilateral symmetry, as shown in FIG. 6.

In FIG. 6, a right output conductive plate 6*b*R and a left output conductive plate 6*b*L are formed identical to each other in their shapes when developed, but with the their directions of bending being changed from each other.

Similarly, though a right power supply connector terminal 11R and a left power supply connector terminal 11L are formed identical to each other in their shapes when developed, their directions of bending are changed from each other.

The conductive plates 6*a*, 6*b*, 6*c* and the power supply connector terminal 11, all of which are formed of the plate material having a thickness of 0.8 mm, include six kinds of plates and terminals comprising the power conductive plates 6*a*, the right output conductive plates 6*b*R, the left output conductive plates 6*b*L, the signal conductive plates 6*c*, the right power supply connector terminals 11R and the left power supply connector terminals 11L.

The sensor connector terminals 12 of the sensor connector 10 arranged in opposition to the vehicle connector 8 are each formed of a phosphor bronze plate having a thickness of 0.64 mm, and each have a press-fit terminal portion 12*p* formed at one end thereof.

In addition, as shown in FIG. 3, holding members H for holding the circuit board 4 are arranged in the vicinity of a side surface of the housing 3. The power conductive plates 6*a* are used as the holding members H as they are, so the holding members H are identical with the power conductive plates 6*a*, and have press-fit terminal portions Hp formed at their tip ends, respectively. Here, note that the holding members H only function to hold the circuit board 4, but are not electrically connected to the circuit board 4.

The press-fit terminal portions 6*ap*, 6*bp*, 6*cp*, 11*p*, 12*p*, Hp are press-fitted into the through holes 4*a* thereby to mechanically hold the circuit board 4 in place.

The cover 7 is molded of an insulating resin similar to the housing 3, and is welded to a flange portion 3*c* formed at an opening of the housing 3 by means of an ultrasonic welding machine.

Here, note that the welding of the cover 7 and the housing 3 may be effected through vibration welding by means of a vibration welding machine. The vibration welding is made in such a manner that the cover 7 is caused to reciprocatingly vibrate along a surface direction of the bonding or coupling surfaces of the cover 7 and the housing 3 so as to melt the resins of the cover 7 and the housing 3 with each other under the action of frictional heating thereby to bond or couple them with each other. The vibration welding is applied when the bonding surfaces of the cover 7 and the housing 3 are large.

Also, laser welding by means of a laser welding machine may be used instead of the ultrasonic welding machine.

For laser welding, the cover 7 is made of a material having a large laser transmittance, and the housing 3 is made of a material having a high laser absorption rate. When a laser beam is irradiated from the cover 7 side, it passes through the cover 7 so that the bonding surface of the housing 3 absorbs the laser beam to generate heat. The heat thus generated is also conducted to the cover 7, whereby the cover 7 is heated to mutually melt the bonding surfaces of the cover 7 and the housing 3 to be welded to each other.

Laser welding can not be used in the molding of a resin in which warpage or shrinkage is large and hence it is difficult for a laser beam to be focused on the bonding surfaces, but in case of the molding of a resin in which warpage or shrinkage is small, welding itself does not generate burrs or vibration, so there is an advantage that the transmission of vibration to internal parts does not occur.

In addition, it is not necessary to form the flange portion 3*c* on the housing 3, as in the above-mentioned ultrasonic welding and vibration welding, so the size of the electronic control apparatus 1 can be reduced.

Now, reference will be made to a procedure of assembling the electronic control apparatus 1, as constructed above.

First of all, a cream solder is coated on the circuit board 4, and then parts such as the microcomputer 13, its peripheral circuit elements, etc., are arranged on the circuit board 4 thus coated with the cream solder, after which the cream solder is melted by using a reflow device so that the individual parts are soldered to the circuit board 4.

Then, as shown in FIG. 2, the housing 3 is arranged on the heat sink 5 and fixedly secured thereto by screws 20. Thereafter, the semiconductor switching elements 2 are arranged on the heat sink 5. In that case, the individual terminals VS, GT1, OUT, GT2, GND of the semiconductor switching elements 2 are guided and positioned by the positioning portions 3*b* so as to be overlapped on the conductive plates 6*a*, 6*b*, 6*c*.

After that, the semiconductor switching elements 2 are placed in intimate contact with the heat sink 5 and fixedly secured thereto by using a plate spring 21 and the screws 20.

Subsequently, a laser beam is irradiated from the terminal (VS, GT1, OUT, GT2, GND) side of the semiconductor switching elements 2, whereby the terminals VS and the power conductive plates 6*a*, the terminals GT1 and the signal conductive plates 6*c*, the terminals OUT and the output conductive plates 6*b*, the terminals GT2 and the signal conductive plates 6*c*, and the terminals GND and the power conductive plates 6*a* are respectively welded to each other by means of laser welding.

Then, the circuit board 4 is mounted onto an upper portion of the housing 3 with the tip ends of the press-fit terminal portions 6*ap*, 6*bp*, 6*cp*, 11*p*, 12*p*, Hp being inserted into the through holes 4*a* in the circuit board 4. Thereafter, the press-fit terminal portions 6*ap*, 6*bp*, 6*cp*, 11*p*, 12*p*, Hp are press-fitted into the through holes 4*a*, respectively, by means of a press machine.

Thereafter, the cover 7 is arranged in the aperture of the housing 3, and the housing 3 and the cover 7 are welded to each other by the ultrasonic welding machine, whereby the assembly of the electronic control apparatus 1 is completed.

As described in the foregoing, the electronic control apparatus 1 according to this first embodiment includes the housing 3 that has opening portions at its opposite ends, respectively, the heat sink 5 that is attached to one end of the housing 3, the semiconductor switching elements 2 that are mounted on the heat sink 5, the circuit board 4 that is arranged in opposition to the heat sink 5, and has the electronic circuit formed thereon including the control circuit for controlling the semiconductor switching elements 2, and the plurality of conductive plates 6a, 6b, 6c that have their basal portions integrated with and held by the housing 3 and electrically connect the circuit board 4 and the semiconductor switching elements 2 to each other.

Accordingly, it becomes unnecessary to use a metal board or the like conventionally required on which the semiconductor switching elements 2 are to be mounted, so the electronic control apparatus 1 can be reduced in size and cost.

In addition, the heat sink 5 is composed of the heat sink main body 40, and the anodized aluminum film 25 that covers the entire surfaces of the heat sink main body 40 except for the cut surfaces 5a, wherein the cut surfaces 5a of the heat sink 5 are arranged in opposition to the inner wall surfaces 3d of one of the opening portions of the housing 3 made of the insulating resin. As a result, even if there occurs a trouble such as an insulation failure due to the destruction of the anodized aluminum film 25 in regions where the semiconductor switching elements 2 are mounted, the semiconductor switching elements 2 will not be electrically short-circuited from outside of the electronic control apparatus 1, so the electronic control apparatus 1 with improved insulation performance can be obtained.

Moreover, the press-fit terminal portions 6ap, 6bp, 6cp, 11p, 12p, Hp are press-fitted into the through holes 4a in the circuit board 4, so that they are electrically connected by pressure contact to the circuit board 4. As a consequence, the resistance to thermal stress can be improved.

Further, the electrical connections between the conductive plates 6a, 6b, 6c and the circuit board 4, and between the connector terminals 11, 12 and the circuit board 4 are carried out only by press-fitting, so the time of assembly can be shortened, the assembly equipment can be made simple, and the assembling efficiency can be improved.

In addition, the conductive plates 6a, 6b, 6c are arranged in the lead-out direction in which the terminals VS, GT1, OUT, GT2, GND of the semiconductor switching elements 2 lead out, so that the conductive plates 6a, 6b, 6c are bonded to the terminals VS, GT1, OUT, GT2, GND. As a result, the individual terminals VS, GT1, OUT, GT2, GND, being formed of elongated thin plates and having large electrical resistance, can be made shorter, so it becomes possible to reduce the electrical resistance between the terminals VS, GT1, OUT, GT2, GND and the circuit board 4, thereby making it possible to suppress the generation of heat due to the electrical resistance. That is, the electronic control apparatus 1 capable of controlling a large current can be obtained.

Moreover, the conductive plates 6a, 6b, 6c are held by the insulating resin 3a of the housing 3 integrally molded therewith, so the working efficiency of welding between the conductive plates 6a, 6b, 6c and the individual terminals VS, GT1, OUT, GT2, GND of the semiconductor switching elements 2 can be improved.

Further, the heat sink 5 is formed by using the heat sink material which is formed of the elongated, extruded shaped material having the anodized aluminum film 25 formed on its surface beforehand. Thus, it is unnecessary to form the anodized aluminum film for each of the individual heat sinks 5 after cutting thereof, so the production cost can be reduced.

Here, note that in case where a heat sink material is used which is formed of an elongated, hot or cold rolled plate material having an anodized aluminum film formed on its surface beforehand, the production cost can be similarly reduced.

Furthermore, the heat sink main body 40 is composed of high thermal conductive aluminum or aluminum alloy, so the heat generated in the semiconductor switching elements 2 is efficiently dissipated or radiated by the heat sink 5, and the heat dissipation of the electronic control apparatus 1 can be improved.

In addition, since the insulating film formed on the surface of the heat sink main body 40 is the alumite or anodized aluminum film 25, the insulating film can be formed thin, so the heat dissipation of the electronic control apparatus 1 can be improved.

Also, since an alumite treatment is applied to the surface of the heat sink main body 40, the emissivity of the heat sink main body 40 becomes high, and hence the heat dissipation of the electronic control apparatus 1 can also be improved.

Here, note that even when a precoated insulating resin is used as the insulating film, the insulating film can be formed thin, so the heat dissipation of the electronic control apparatus 1 can be improved.

Moreover, the two semiconductor switching elements 2 are fixedly secured to the heat sink 5 in a lump by means of the screw 20 through the intermediary of the plate spring 21, so the fixed securement of the semiconductor switching elements 2 becomes easy, and the assembling efficiency of the electronic control apparatus 1 can be improved.

Further, the grease of high thermal conductivity is interposed between the heat spreader hs of the semiconductor switching elements 2 and the anodized aluminum film 25 of the heat sink 5, so the thermal resistance of a radiation or heat dissipation path from the semiconductor switching elements 2 to the heat sink 5 becomes smaller, thus improving the heat dissipation of the electronic control apparatus 1.

Here, note that in case where the heat spreader hs of the semiconductor switching elements 2 are fixedly secured to the heat sink 5 by means of the first adhesive resin of high thermal conductivity, too, the fixed securement of the semiconductor switching elements 2 becomes easy, and the assembling efficiency of the electronic control apparatus 1 can be improved. In addition, the thermal resistance of the heat dissipation path from the semiconductor switching elements 2 to the heat sink 5 becomes smaller, thus improving the heat dissipation of the electronic control apparatus 1.

Moreover, the mounting leg portions 3L of the housing 3 are formed at a side opposite to a side at which the heat sink 5 is mounted, so when the electronic control apparatus 1 is mounted to a vehicle that is an installation or mounting object, the heat sink 5 is located at a side opposite to a mounting surface of the vehicle, as a consequence of which the heat dissipation of the heat sink 5 can be improved.

EMBODIMENT 2

Figure 7:
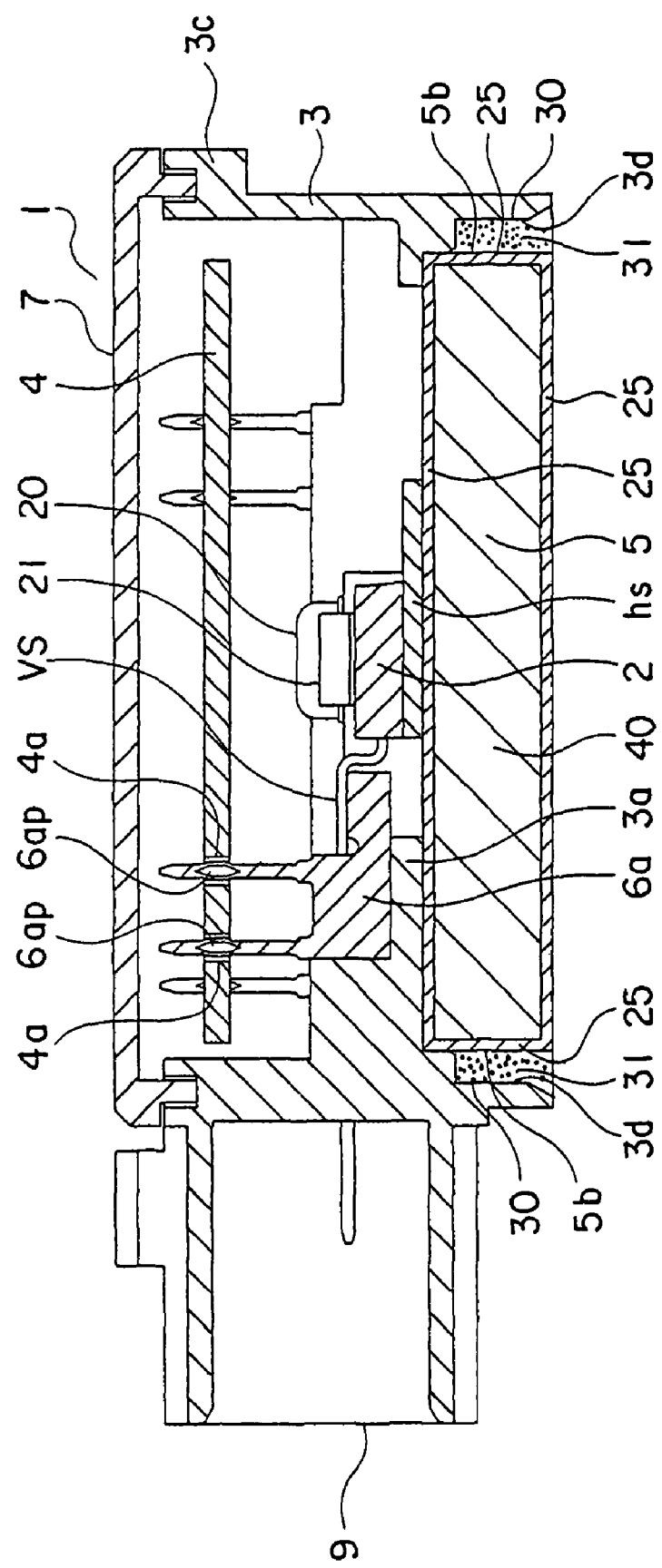
FIG. 7 is a cross sectional view showing an electronic control apparatus in an electric power steering system according to a second embodiment of the present invention.
Figure 8:
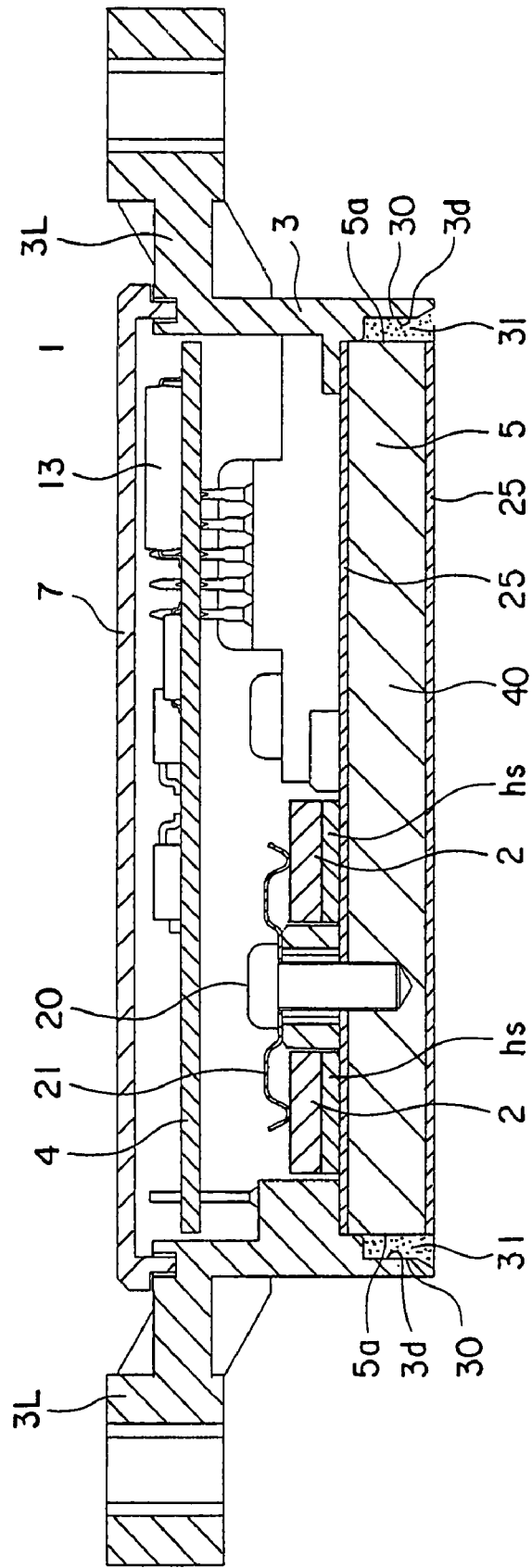
FIG. 8 is a cross sectional view cut off at right angles to the cross-section of the electronic control apparatus shown in FIG. 7.

FIG. 7 shows, in cross section, an electronic control apparatus 1 according to a second embodiment of the present invention, and FIG. 8 is a cross sectional view of the electronic control apparatus 1 of FIG. 7 when the electronic control apparatus 1 is cut along a direction orthogonal to the cross section of FIG. 7.

In this second embodiment, a groove 30 is formed between the outer peripheral end faces of the heat sink 5 and the inner wall surfaces 3d of one of the opening portions of the housing (3), and an adhesive or bonding resin in the form of a silicon bonding material 31 is filled into the groove 30.

In addition, the vehicle connector 8, the motor connector 9 and the sensor connector 10 of the first embodiment are changed to corresponding connectors of the waterproof type, respectively, which are integrally molded with the housing 3.

Though not illustrated, a respiration or breathing hole for providing fluid communication between the inside and the outside of the electronic control apparatus 1 is formed through the housing 3, and a water-repellent filter, which permits the passage of air but prevents the passage of water therethrough, is mounted in the respiration hole.

The construction of this second embodiment other than the above is similar to that of the electronic control apparatus 1 of the first embodiment.

The assembly procedure of the electronic control apparatus 1 according to this second embodiment is the same as that of the first embodiment until the welding step in which the cover 7 is arranged in an opening portion of the housing 3, and is welded to the housing 3 by means of an ultrasonic welding machine.

Thereafter, the water-repellent filter is attached by heat welding to the respiration hole formed in the housing 3. Then, the electronic control apparatus 1 is inverted or turned upside down to place the groove 30 into an upwardly directed or opened position, so that the silicon bonding material 31 is filled into the groove 30. Thereafter, the silicon bonding material 31 is set or hardened, and the assembly of the electronic control apparatus 1 is thus completed.

Here, note that the respiration hole may be formed in the cover 7 instead of the housing 3, and the water-repellent filter may be attached to this respiration hole. In addition, the respiration hole may first be formed through the housing 3 or the cover 7, and the water-repellent filter is attached to this respiration hole beforehand, after which the above-mentioned first welding step and the above-mentioned second welding step may be carried out.

According to the electronic control apparatus 1 of this second embodiment, the groove 30 is formed between the housing 3 and the heat sink 5, and the silicon bonding material 31 is filled into the groove 30. With such an arrangement, The interior of the electronic control apparatus 1 is sealed to the outside, so that it is possible to prevent the infiltration of water or the like from the outside into the interior of the electronic control apparatus 1, thereby improving the waterproofness of the electronic control apparatus 1.

Moreover, the cut surfaces 5a of the heat sink 5, being covered with the silicon bonding material 31, are not exposed to the outside, as a consequence of which even if there occurs a trouble such as an insulation failure due to the destruction or the like of the anodized aluminum film 25 in regions where the semiconductor switching elements 2 are mounted, the semiconductor switching elements 2 will not be electrically short-circuited from outside of the electronic control apparatus 1 through the cut surfaces 5a, so the electrical insulation performance of the electronic control apparatus 1 can be improved.

Further, the cut surfaces 5a of the heat sink 5 are covered with the silicon bonding material 31, and hence the entire surfaces of the heat sink main body 40 are covered with the anodized aluminum film 25 and the silicon bonding material 31, so even if liquid such as salt water which corrodes aluminum is attached to the electronic control apparatus 1, corrosion of the heat sink 5 can be prevented, thus making it possible to improve the corrosion resistance of the electronic control apparatus 1.

Although in the above-mentioned first and second embodiments, the bonding connections between the individual terminals VS, GT1, OUT, GT2, GND of the semiconductor switching elements 2 and the conductive plates 6a, 6b, 6c are made by means of laser welding, there may instead be used other welding methods such as resistance welding, TIG welding, etc. Also, ultrasonic bonding other than welding may instead be used.

Moreover, in the semiconductor switching elements 2, a half bridge having the high side MOSFET 2H and the low side MOSFET 2L integrated with each other is received in one package, and a pair of half bridges are used as one set and combined with each other to form a bridge circuit for switching the current of the electric motor 22, but the high side MOSFET 2H and the low side MOSFET 2L may be separately constructed, so that four separate or independent semiconductor switching elements 2 may be used to form such a bridge circuit. Also, six semiconductor switching elements 2 may be used to form a bridge circuit for driving and controlling a three-phase blushless motor.

Although the power device is composed of the semiconductor switching elements 2, other power devices such as diodes, thyristors, etc., may instead be used.

Further, the thickness of the conductive plates 6a, 6b, 6c is set to 0.8 mm, but other thicknesses such as 1 mm, 1.2 mm, etc., may be used as the thickness of the conductive plates 6a, 6b, 6c in consideration of the current flowing through the conductive plates 6a, 6b, 6c, the intervals between the adjacent individual terminals VS, GT1, OUT, GT2, GND of the semiconductor switching elements 2, etc.

In addition, reference has been made to an example in which the present invention is applied to an electric power steering system in a motor vehicle, but the present invention can be applied to an electronic control apparatus, which is provided with a power device and can handle large current (e.g., 25 A or more), such as an electronic control apparatus in an antilock brake system (ABS), an electronic control apparatus associated with air conditioning, etc.

While the invention has been described in terms of preferred embodiments, those skilled in the art will recognize that the invention can be practiced with modifications within the spirit and scope of the appended claims.

What is claimed is:

1. An electronic control apparatus comprising: a housing that is made of an insulating resin and has a pair of opening portions at opposite ends thereof, respectively; a heat sink that is attached to one end of said housing; a power device that is mounted on said heat sink; a circuit board that is arranged in opposition to said heat sink, and has an electronic circuit including a control circuit for controlling said power device; and a plurality of conductive plates that have their basal portions held by said housing and electrically connect said circuit board and said power device to each other; wherein the heat sink is composed of a heat sink main body, and an insulating film that is formed at least on a surface of said heat sink main body at a side at which said power device is mounted thereon; wherein said heat sink main body has outer peripheral end faces arranged in opposition to inner wall surfaces of one of said opening portions of said housing; wherein said heat sink main body has a first pair of opposite outer peripheral end faces, and a second pair of opposite outer peripheral end faces, which have said insulating film formed thereon, wherein a groove is formed between the insulating film formed on the second pair of opposite outer peripheral end faces of said heat sink main body and the inner wall surfaces of one of said opening portions of said housing, and a first adhesive resin is filled into said groove, and wherein said first adhesive resin is filled into said groove between said first pair of opposite outer peripheral end faces of said heat sink main body and said inner wall surfaces of one of said opening portions of said housing.

2. The electronic control apparatus as set forth in claim 1, wherein
said heat sink main body is composed of aluminum or an aluminum alloy.

3. The electronic control apparatus as set forth in claim 2, wherein
said insulating film is an anodized aluminum film.

4. The electronic control apparatus as set forth in claim 1, wherein
said insulating film is an insulating resin precoated on the surfaces of said heat sink main body.

5. The electronic control apparatus as set forth in claim 1, wherein
said heat sink is formed by using a plate material.

6. The electronic control apparatus as set forth in claim 1, wherein
said heat sink is formed by using an extruded shaped material.

7. The electronic control apparatus as set forth in claim 1, wherein
said power device is fixedly secured to said heat sink by means of a second adhesive resin.

8. The electronic control apparatus as set forth in claim 7, wherein
said second adhesive resin is composed of a high thermal conductive material.

9. The electronic control apparatus as set forth in claim 1, wherein
said power device is fixedly secured to said heat sink by a resilient member.

10. The electronic control apparatus as set forth in claim 9, wherein
a grease of high thermal conductivity is interposed between said power device and said heat sink.

11. The electronic control apparatus as set forth in claim 1, wherein
a mounting leg portion to be mounted on a mounting object is formed on a second end of said housing, which is opposite to said first end of said housing.

12. The electronic control apparatus as set forth in claim 1, wherein
said power device is a semiconductor switching element.

13. An electronic control apparatus comprising: a housing that is made of an insulating resin and has a pair of opening portions at opposite ends thereof, respectively; a heat sink that is attached to a first end of said housing; a power device that is mounted on said heat sink; a circuit board that is arranged in opposition to said heat sink, and has an electronic circuit including a control circuit for controlling said power device; and a plurality of conductive plates that have their respective basal portions held by said housing and electrically connect said circuit board and said power device to each other; wherein the heat sink is composed of a heat sink main body, and an insulating film that is formed at least on a surface of said heat sink main body at a side at which said power device is mounted thereon; wherein said heat sink main body has outer peripheral end faces arranged in opposition to inner wall surfaces of one of said opening portions of said housing, wherein said power device directly contacts said heat sink, wherein said power device comprises a plurality of terminals, wherein each one of said terminals extends from said power device in substantially a same direction, with substantially a same shape, so as to extend vertically and bend perpendicularly at two intermediate locations, wherein each one of said conductive plates extends in a first direction toward a respective one of said terminals so as to overlap and connect to said respective one of said terminals, wherein each one of said conductive plates has a length in said first direction and a width in a second direction orthogonal to said first direction, said length being greater than said width, wherein said heat sink main body has a first pair of opposite outer peripheral end faces, and a second pair of opposite outer peripheral end faces, which have said insulating film formed thereon, wherein a groove is formed between the insulating film formed on the second pair of opposite outer peripheral end faces of said heat sink main body and the inner wall surfaces of one of said opening portions of said housing, and a first adhesive resin is filled into said groove, and wherein said first adhesive resin is filled into said groove between said first pair of opposite outer peripheral end faces of said heat sink main body and said inner wall surfaces of one of said opening portions of said housing.

14. The electronic control apparatus according to claim 13, wherein said power device comprises a heat spreader; and
wherein said heat spreader directly contacts said heat sink.

* * * * *